United States Patent
Shiraishi et al.

(10) Patent No.: US 9,500,708 B2
(45) Date of Patent: Nov. 22, 2016

(54) SWITCH FAILURE DETECTION DEVICE, BATTERY PACK INCLUDING THE SAME, AND METHOD OF DETECTING FAILURE OF ELECTRONIC SWITCH

(71) Applicant: GS Yuasa International Ltd., Kyoto-shi (JP)

(72) Inventors: Takeyuki Shiraishi, Kyoto (JP); Takeshi Itagaki, Kyoto (JP)

(73) Assignee: GS YUASA INTERNATIONAL LTD., Kyoto-Shi, Kyoto (JP)

( * ) Notice: Subject to any disclaimer, the term of this patent is extended or adjusted under 35 U.S.C. 154(b) by 0 days.

(21) Appl. No.: 15/178,980

(22) Filed: Jun. 10, 2016

(65) Prior Publication Data

US 2016/0282415 A1    Sep. 29, 2016

Related U.S. Application Data

(63) Continuation of application No. 14/796,659, filed on Jul. 10, 2015, now Pat. No. 9,383,412, which is a continuation of application No. 13/781,558, filed on Feb. 28, 2013, now Pat. No. 9,121,907.

(30) Foreign Application Priority Data

Mar. 1, 2012 (JP) ................................. 2012-045676

(51) Int. Cl.
*G01R 31/02* (2006.01)
*G01R 31/327* (2006.01)

(52) U.S. Cl.
CPC ......... *G01R 31/327* (2013.01); *G01R 31/3277* (2013.01)

(58) Field of Classification Search
CPC ............... H02J 2007/0037; H02J 2007/004; H02J 2007/0067; H02J 7/00; H02J 7/0019; H02J 7/0024; H02J 7/0026; H02J 7/0031; G01R 31/327; G01R 31/3277; G01R 19/16542; H01M 10/44; H01M 10/48; H01M 2200/00; B60L 3/0046

USPC ............. 324/762.08, 762.09, 768, 769, 415, 324/416; 320/104, 112, 118, 128, 162, 320/134–137, 163, 164; 307/85, 64; 361/90, 91.1

See application file for complete search history.

(56) References Cited

U.S. PATENT DOCUMENTS 4,618,921 A * 10/1986 Ikeda .................. H02M 7/1623 363/128
4,705,962 A * 11/1987 Kinoshita ............ H03K 17/284 327/381

(Continued)

FOREIGN PATENT DOCUMENTS

| GB | 1404192 A * | 8/1975 | ......... H03K 17/0403 |
| JP | 9-17455 A | 1/1997 | |

(Continued)

OTHER PUBLICATIONS

U.S. Notice of Allowance dated Apr. 29, 2015 in U.S. Appl. No. 13/781,558.

(Continued)

*Primary Examiner* — Patrick Assouad
*Assistant Examiner* — Sean Curtis
(74) *Attorney, Agent, or Firm* — McGinn IP Law Group, PLLC

(57) ABSTRACT

A switch failure detector configured to be installed in an electric system including an electric storage device, the switch failure detector includes at least one electronic switch connected in a path in which a charging current to the electric storage device and a discharging current from the electric storage device flow, at least one rectifier for passing a discharging current by bypassing the electronic switch when the electronic switch is turned off, a switch voltage detection circuit configured to detect a voltage drop caused by the at least one electronic switch, and a controller for sending an on-command signal to the at least one electronic switch to turn on the electronic switch, and receiving the voltage detected by the switch voltage detection circuit while the on-command signal is sent to the electronic switch.

15 Claims, 4 Drawing Sheets

(56) References Cited

U.S. PATENT DOCUMENTS

| | | | | |
|---|---|---|---|---|
| 5,258,244 A * | 11/1993 | Hall | H02J 7/0016 | 337/15 |
| 5,264,777 A * | 11/1993 | Smead | H02J 7/0024 | 320/126 |
| 5,530,336 A * | 6/1996 | Eguchi | H02J 7/0013 | 320/118 |
| 5,672,952 A * | 9/1997 | Szepesi | H02J 7/0031 | 320/164 |
| 5,783,322 A * | 7/1998 | Nagai | H01M 10/48 | 320/134 |
| 5,808,446 A * | 9/1998 | Eguchi | H02J 7/0093 | 320/134 |
| 5,825,155 A * | 10/1998 | Ito | G01R 19/16542 | 320/118 |
| 5,896,025 A * | 4/1999 | Yamaguchi | H02J 7/0031 | 320/134 |
| 6,060,864 A * | 5/2000 | Ito | G01R 19/16542 | 320/134 |
| 6,198,255 B1 * | 3/2001 | Yoshida | H02J 7/0031 | 320/134 |
| 6,917,124 B2 * | 7/2005 | Shetler, Jr. | H02J 9/061 | 307/66 |
| 7,183,748 B1 * | 2/2007 | Unno | H02J 7/0013 | 320/134 |
| 7,436,151 B2 * | 10/2008 | Wang | H02J 7/0031 | 320/134 |
| 7,463,009 B2 * | 12/2008 | Chang | H02J 7/0016 | 320/118 |
| 7,602,623 B2 * | 10/2009 | Chung | H02M 3/1584 | 361/18 |
| 7,642,750 B2 * | 1/2010 | Liu | H02J 7/0068 | 320/127 |
| 8,183,835 B2 * | 5/2012 | Takeda | H01M 2/34 | 320/112 |
| 8,305,044 B2 * | 11/2012 | Kawamoto | H01M 10/425 | 320/152 |
| 8,390,258 B2 * | 3/2013 | Yamashita | H01M 10/44 | 320/127 |
| 8,415,927 B2 * | 4/2013 | Wang | H02J 7/0031 | 320/134 |
| 8,493,033 B2 * | 7/2013 | Banta | H02J 9/061 | 320/137 |
| 8,503,201 B2 * | 8/2013 | Reilly | H02M 1/34 | 363/125 |
| 8,865,328 B2 * | 10/2014 | Kim | H02J 7/0031 | 320/134 |
| 2005/0162131 A1 * | 7/2005 | Sennami | H01M 2/1022 | 320/128 |
| 2007/0075684 A1 | 4/2007 | Liu et al. | | |
| 2007/0194759 A1 * | 8/2007 | Shimizu | H02J 7/0016 | 320/166 |
| 2008/0036432 A1 * | 2/2008 | Takada | H01M 8/04559 | 323/234 |
| 2008/0116851 A1 * | 5/2008 | Mori | H01M 2/34 | 320/134 |
| 2008/0150483 A1 * | 6/2008 | Morita | H02J 7/0016 | 320/122 |
| 2009/0021077 A1 * | 1/2009 | Zilberberg | H02J 9/065 | 307/66 |
| 2009/0168472 A1 | 7/2009 | Chung et al. | | |
| 2010/0013324 A1 * | 1/2010 | Yamashita | H01M 10/44 | 307/125 |
| 2011/0109275 A1 * | 5/2011 | Taniguchi | H01M 10/44 | 320/145 |
| 2011/0305926 A1 * | 12/2011 | Kim | H02J 7/0031 | 429/7 |
| 2012/0199172 A1 * | 8/2012 | Avrutsky | H03K 17/082 | 136/244 |
| 2012/0268969 A1 * | 10/2012 | Cuk | H02M 7/48 | 363/17 |
| 2013/0033233 A1 * | 2/2013 | Noda | H01M 10/44 | 320/134 |
| 2013/0093396 A1 * | 4/2013 | Dien | H02J 7/0013 | 320/118 |

FOREIGN PATENT DOCUMENTS

| | | | |
|---|---|---|---|
| JP | 2007-104896 A | | 4/2007 |
| JP | 2008-005593 A | | 1/2008 |
| JP | 2008005593 A | * | 1/2008 |
| JP | 2009-60734 A | | 3/2009 |
| JP | 2009-192477 A | | 8/2009 |
| JP | 2010-251104 | | 11/2010 |

OTHER PUBLICATIONS

U.S. Office Action dated Jan. 29, 2015 in U.S. Appl. No. 13/781,558.
U.S. Office Office Action dated Jul. 7, 2014 in U.S. Appl. No. 13/781,558.
U.S. Notice of Allowance dated Mar. 10, 2016 in U.S. Appl. No. 14/796,659.
U.S. Notice of Allowance dated Dec. 9, 2015 in U.S. Appl. No. 14/796,659.
U.S. Office Action dated Aug. 31, 2015 in U.S. Appl. No. 14/796,659.
Japanese Office Action dated Dec. 17, 2015 with a partial English translation.

* cited by examiner

SWITCH FAILURE DETECTION DEVICE, BATTERY PACK INCLUDING THE SAME, AND METHOD OF DETECTING FAILURE OF ELECTRONIC SWITCH

The present application is a Continuation Application of U.S. patent application Ser. No. 14/796,659, filed on Jul. 10, 2015, which is a Continuation Application of U.S. patent application Ser. No. 13/781,558, filed on Feb. 28, 2013, now U.S. Pat. No. 9,121,907, which is based on and claims priority from Japanese patent application No. 2012-45676, filed on Mar. 1, 2012, the entire contents of which are incorporated herein by reference.

TECHNICAL FIELD

The technology described in this specification relates to detection of failure of a switch configured to shut off charging or discharging currents.

BACKGROUND

An electric storage device such as a lithium-ion battery may be overcharged or over-discharged due to variations in capacity between cells or a failure of a peripheral device such as a charger and a load. Therefore, a known battery pack may include an overcharge/over-discharge protection function. Such a battery pack may include an electronic switch such as an FET and a monitoring unit. The switch is connected in a current path in which a charging current or a discharging current flows. The monitoring unit is configured to measure a terminal voltage of the electric storage device. If the terminal voltage reaches a predetermined level during charging of the electric storage device, the switch is turned off to shut off the charging current so that the electric storage device is protected against overcharge.

A known battery pack including a protection function may have the following configuration. If a voltage between an input and an output of an electronic switch, that is, a voltage drop during charging is large, an abnormal condition in which an on resistance is excessively high due to a failure of the switch is determined. If the abnormal condition is determined, the switch is turned off to disable a battery.

In such a battery pack, the switch may not be turned off if a short circuit occurs between the input and the output of the switch or for some reasons. If the switch cannot be turned off, the protection function may not be properly performed. As a result, the electric storage device may be overcharged or over-discharged. Even if an abnormal condition of the switch is detected, the battery cannot be disabled because the switch cannot be turned off.

A turn-off problem of the switch may be detected in advance by turning the switch from on to off. However, power supply to a load may be stopped if switch failure detection is performed as such on a discharging current shut-off switch during discharging. If the switch failure detection is performed on a charging current shut-off switch during charging, power supply to the electric storage device may be stopped.

SUMMARY

A switch failure detection device may be installed in an electric system including an electric storage device. The switch failure detection device includes at least one electronic switch, at least one rectifier, a switch voltage detection circuit, and a controller.

The electronic switch is to be connected in a path in which a charging current to the electric storage device and a discharging current from the electric storage device flow. The electronic switch is switched between on and off. The rectifier is configured to pass a discharging current by bypassing the electronic switch when the electronic switch is turned off. The switch voltage detection circuit is configured to detect a voltage between an input and an output of the electronic switch.

The controller is configured to: determine whether the electric storage device is in a discharging state; send an off-command signal to the electronic switch to turn off the electronic switch if the electric storage device is in the discharging state; receive the voltage detected by the switch voltage detection circuit while the off-command signal is sent to the electronic switch; determine an input-output voltage of the electronic switch based on the voltage; determine whether the input-output voltage is lower than a reference voltage; and determine the electronic switch has a turn-off problem in which the electronic switch does not turn off according to the off-command signal if the input-output voltage is lower than the reference voltage.

DETAILED DESCRIPTION

Figure 1:
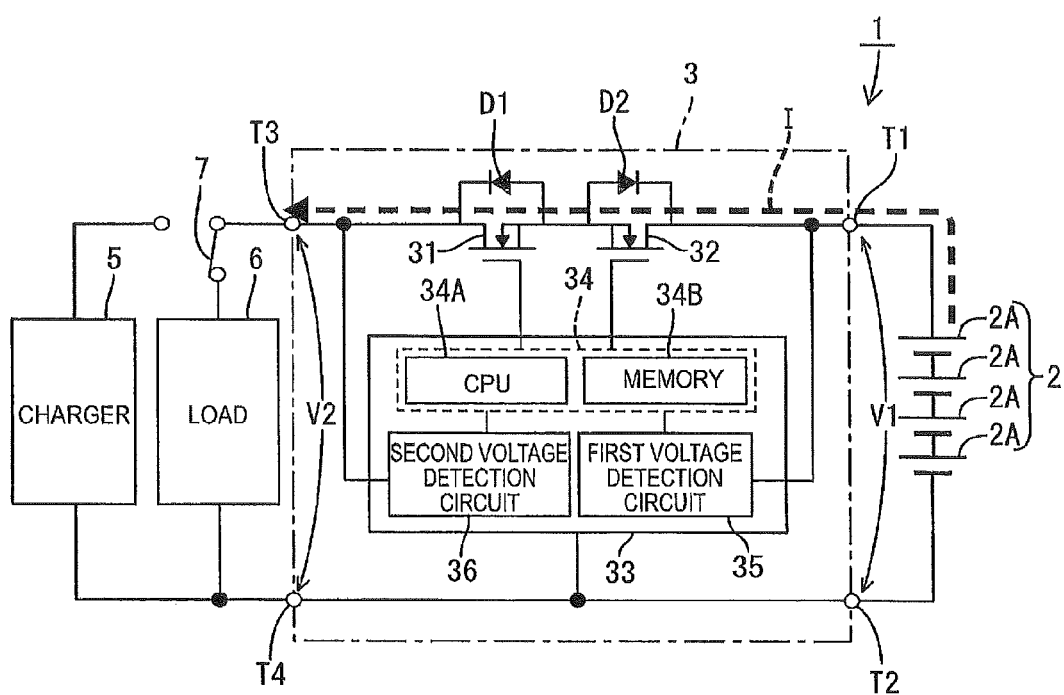
FIG. 1 is a circuit diagram of a battery pack according to an embodiment.
Figure 2:
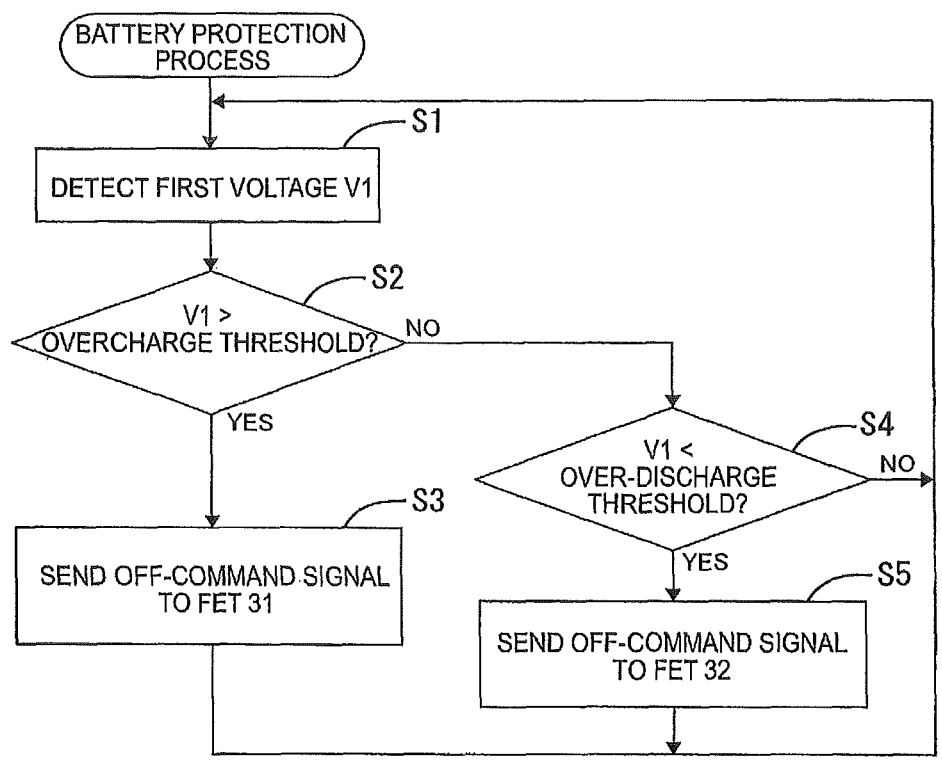
FIG. 2 is a flowchart of battery protection process.

An embodiment will be described with reference to FIGS. 1 to 4. A battery pack 1 includes a secondary battery 2 and a battery protection circuit 3. The battery pack 1 may be installed in an electric vehicle or a hybrid vehicle and supply power to various devices in the vehicle. The secondary battery 2 is an example of an electric storage device. A capacitor may be used instead of the secondary battery 2. The battery protection circuit 3 is an example of a switch failure detection device. The battery pack 1 may include a connector for electrically connecting the secondary battery 2 to an external device.

Electric Configuration of Battery Pack

The secondary battery 2 is a lithium-ion battery and an assembled battery including four cells 2A connected in series. Alternatively, the secondary battery 2 may include only one cell 2A. Further alternatively, the secondary battery 2 may include two series-connected cells 2A, three series-connected cells 2A, or five or more series-connected cells 2A.

The battery protection circuit 3 includes first to fourth connection terminals T1 to T4, a charging current shutoff FET 31, a discharging current shutoff FET 32, and a battery monitoring unit 33. The secondary battery 2 is connected between the first and the second connection terminals T1 and T2. External devices including a charger 5 and a load 6 are selectively connected between the third and the fourth connection terminals T3 and T4 via a selector 7.

The charging current shutoff FET 31 and the discharging current shutoff FET 32 are N-channel MOSFETs including parasitic diodes D1 and D2, respectively. The charging current shutoff FET 31 and the discharging current shutoff FET 32 are examples of switches and rectifiers. The drain of the charging current shutoff FET 31 and that of the discharging current shutoff FET 32 are commonly connected. Namely, the charging current shutoff FET 31 and the discharging current shutoff FET 32 are connected back-to-back. The source and the gate of the charging current shutoff FET 31 are connected to the connection terminal T3 and the battery monitoring unit 33, respectively. The source and the gate of the discharging current shutoff FET 32 are connected to the connection terminal T1 and the battery monitoring unit 33, respectively.

The battery monitoring unit 33 includes a controller 34, a first voltage detection circuit 35, and a second voltage detection circuit 36. The controller 34 includes a central processing unit (CPU) 34A and a memory 34B. The memory 34B stores various programs that are provided for controlling operations of the battery monitoring unit 33. The CPU 34A reads out the programs from the memory 34B and controls the components of the battery monitoring unit 33 according to the programs. The memory 34B includes RAM and ROM. The medium on which the programs are stored is not limited to RAM. A non-volatile memory such as CD-ROM, hard disk drive, and a flash memory can be used.

The first voltage detection circuit 35 is an example of switch voltage detection circuit. The first voltage detection circuit 35 detects a first voltage V1 between the first and the second connection terminals T1 and T2. The first voltage V1 is an example of a terminal voltage of the electric storage device. The first voltage detection circuit 35 sends a detection signal corresponding to the first voltage V1 to the controller 34. The first voltage V1 is proportional to a terminal voltage of the secondary battery 2. The second voltage detection circuit 36 detects a second voltage V2 between the third and the fourth connection terminals T3 and T4. The second voltage detection circuit 36 sends a detection signal to the controller 34. The second voltage V2 is proportional to an output voltage of the charger 5 or a voltage across the load 6.

Controls on Battery Monitoring Unit

When the battery protection circuit 3 is turned on, the CPU 34A starts sending on-command signals to the charging current shutoff FET 31 and the discharging current shutoff FET 32. The on-command signals are for turning on, or closing, the charging current shutoff FET 31 and the discharging current shutoff FET 32. The charging current shutoff FET 31 and the discharging current shutoff FET 32 remain turned on while receiving the on-command signals.

When the selector 7 is thrown to a charger position and connection between the third connection terminal T3 and the charger 5 is established, the power is supplied from the charger 5 to the secondary battery 2. As a result, the secondary battery 2 is charged. When the selector 7 is thrown to a load position and connection between the third connection terminal T3 and the load 6 is established, the secondary battery 2 starts discharging, and the power is supplied from the secondary battery 2 to the load 6 (see FIG. 1). The CPU 34A reads out the programs from the memory 34B and performs a battery protection process illustrated in FIG. 2 and a switch failure detection process illustrated in FIG. 3.

Battery Protection Process

In the battery protection process, the CPU 34A continuously or periodically detects the first voltage V1 based on the detection signal from the first voltage detection circuit 35 (S1). The CPU 34A determines whether the first voltage V1 is higher than an overcharge threshold (S2). A preferable level of the overcharge threshold is slightly lower than the first voltage V1 when the secondary battery 2 is in an overcharged state and slightly higher than the first voltage V1 when the secondary battery 2 is in an over-discharged state. The overcharge threshold may be defined in advance based on an experiment in which the secondary battery 2 is set in the overcharged state and the first voltage V is measured.

If the first voltage V1 is higher than the overcharge threshold (YES in S1), the CPU 34A performs an overcharge control step to send an off-command signal to the charging current shutoff FET 31 (S3). The CPU 34A performs the overcharge control step because the secondary battery may enter the overcharged state. The charging current shutoff FET 31 is turned off, that is, opened, and the charging current from the charger 5 is shut off by the parasitic diode D1. This terminates the charge of the secondary battery 2. Therefore, the secondary battery 2 is less likely to enter the overcharged state. The CPU 34A returns to step S1 when the overcharge control step is complete.

If the first voltage V1 is lower than an overcharge threshold (NO in S2), the CPU 34A determines whether the first voltage V1 is lower than the over-discharge threshold (S4). The over-discharge threshold may be defined in advance based on an experiment in which the secondary battery 2 is set in the over-discharged state and the first voltage V is measured.

If the first voltage V1 is lower than the over-discharge threshold (YES in S4), the CPU 34A performs an over-discharge control step to send an off-command signal to the discharging current shutoff FET 32 (S5). The CPU 34A performs the over-discharge control step because the secondary battery may enter the over-discharged state. The discharging current shutoff FET 32 is turned off and the discharging current from the secondary battery 2 is shut off by the parasitic diode D2. This terminates the discharge of the secondary battery 2. Therefore, the secondary battery 2 is less likely to enter the over-discharged state. The CPU 34A returns to step S1 when the over-discharge control step is complete.

If the first voltage V1 is higher than the over-discharge threshold (NO in S4), the CPU 34A returns to step S1. In this case, the CPU 34A continues sending the on-command signals to the charging current shutoff FET 31 and the discharging current shutoff FET 32.

Switch Failure Detection Process

Figure 3:
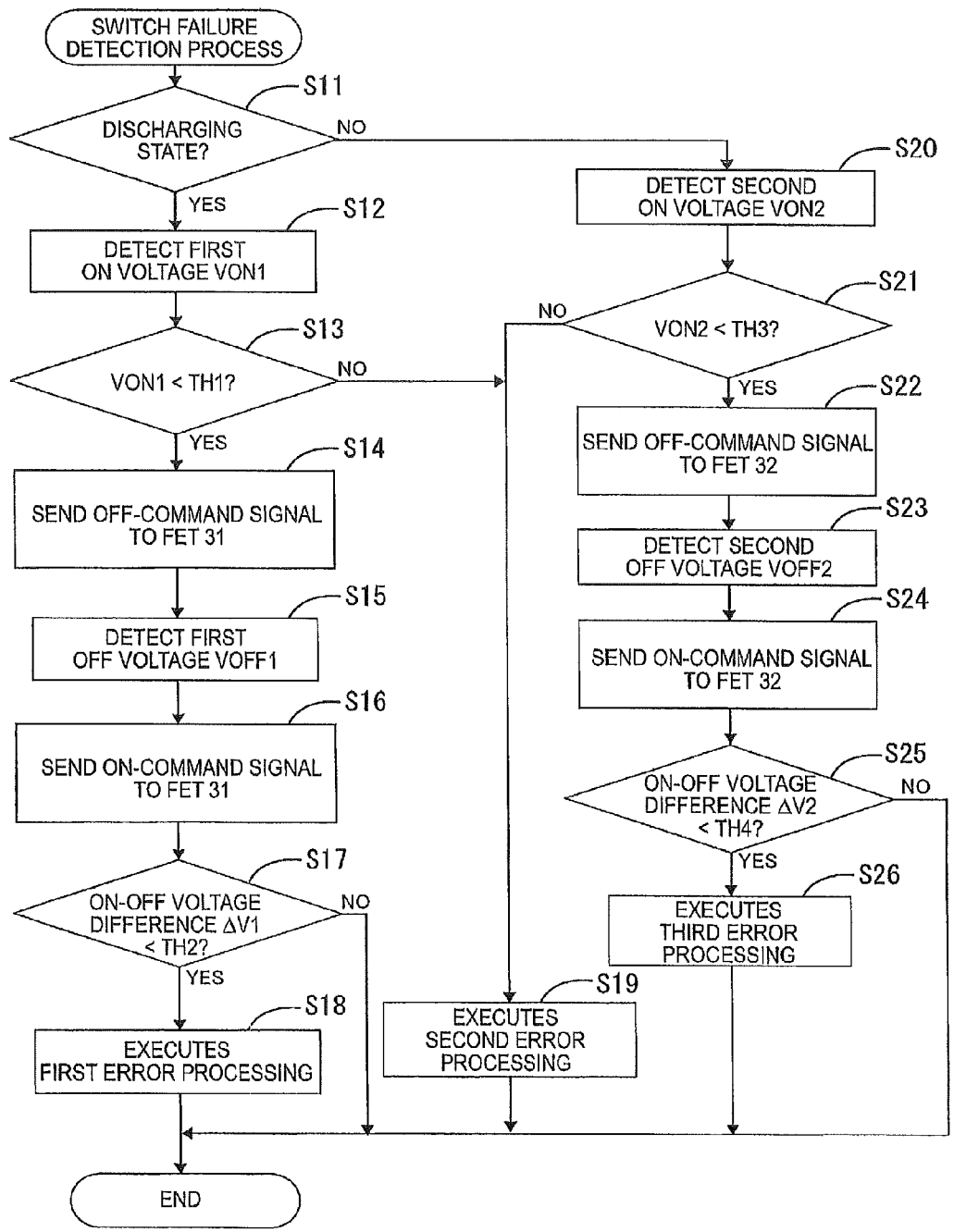
FIG. 3 is a flowchart of a switch failure detection process.

The CPU 34A executes the switch failure detection process illustrated in FIG. 3 if a specific condition is satisfied while the on-command signals are sent to the charging current shutoff FET 31 and the discharging current shutoff FET 32. The specific condition may be power-up of the vehicle or predetermined elapsed time since the previous switch failure detection process.

The CPU 34A determines whether the secondary battery 2 is in the discharging state (S11). The CPU 34A may determine the state of the secondary battery 2 based on an instruction signal from an engine control unit (ECU, not illustrated) or the charger 5. The discharging state includes a state in which the secondary battery 2 outputs a small current such as a dark current after the load 6 is disconnected. The current protection circuit 3 may include a current sensor to detect the discharging current. With this configuration, the current protection circuit 3 may determine the discharging state based on the current, more specifically, a direction of current, detected by the current sensor.

Switch Failure Detection Process for Charging Current Shutoff FET 31

If the secondary battery 2 is in the discharging state (YES in S11), the CPU 34A detects a first on voltage VON1 between the first connection terminal T1 and the third connection terminal T3 (S12). The on voltage VON1 is an example of a terminal voltage. Specifically, the on voltage VON1 is a voltage drop between the FETs 31 and 32 while the on-command signals are sent to the FETs 31 and 32. In this embodiment, a voltage difference between the first voltage V1 and the second voltage V2 is calculated based on the detection signals from the first voltage detection circuit 35 and the second voltage detection circuit 36, and defined as the on voltage VON1.

The CPU 34 determines whether the on voltage VON1 is lower than a first threshold TH1 (S13). The first threshold TH1 is an example of a second reference value. A preferable level of the first threshold TH1 is slightly higher than the on voltage VON1 that is detected when the voltage detection circuits 35 and 36 and the FETs 31 and 32 are not defective and able to perform proper operations.

Figure 4:
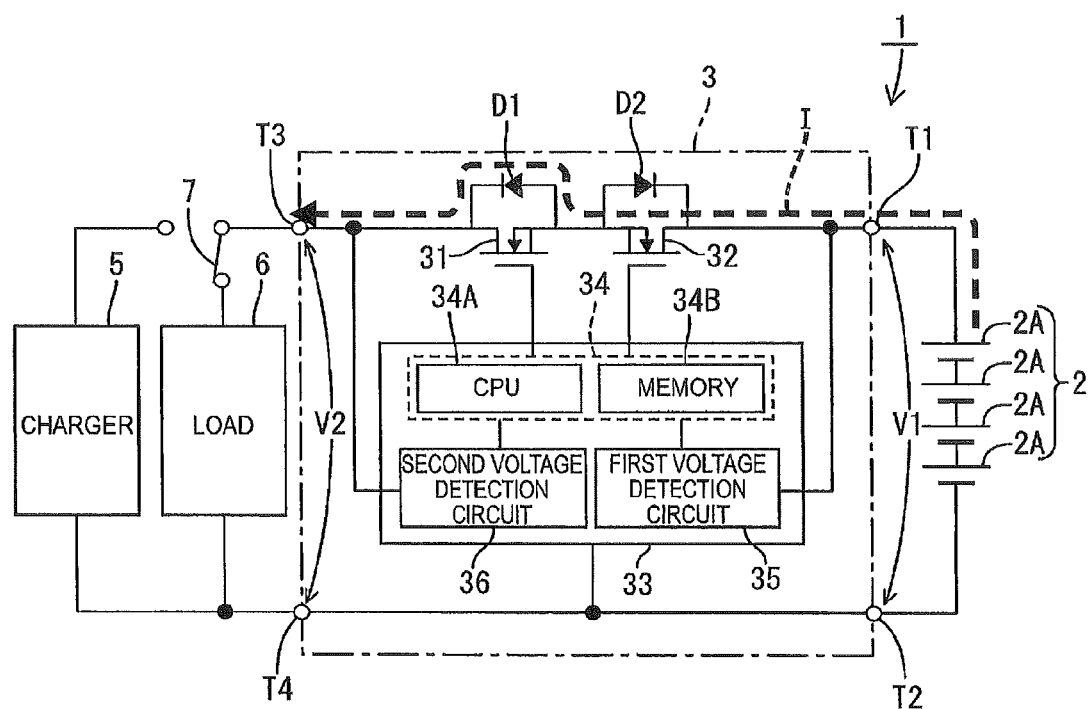
FIG. 4 is a circuit diagram of the battery pack with a charging current shutoff FET turned off.

If the on voltage VON1 is lower than the first threshold TH1 (YES in S13), the CPU 34A sends the off-command signal to the charging current shutoff FET 31 to turn off the charging current shutoff FET 31 (S14). The CPU 34A turns off the charging current shutoff FET 31 because the voltage detection circuits 35 and 36 and the FETs 31 and 32 are in conditions to perform proper operations if the on voltage VON1 is lower than the first threshold TH1. As illustrated in FIG. 4, a forward direction of the parasitic diode D1 corresponds to a direction in which a discharging current I flows. Therefore, the discharging current I continues flowing into the load 6 via the parasitic diode D1 after the charging current shutoff FET 31 is turned off.

The CPU 34A detects a first off voltage VOFF1 between the first connection terminal T1 and the second connection terminal T3 (S15). The off voltage VOFF1 is an example of a voltage between an input and an output of an electronic switch. Specifically, the off voltage VOFF1 is a voltage drop between the FETs 31 and 32 during sending of the off-command signal to the charging current shutoff FET 31 and the on-command signal to the discharging current shutoff FET 32. In this embodiment, a voltage difference between the first voltage V1 and the second voltage V2 is calculated based on the detection signals from the first voltage detection circuit 35 and the second voltage detection circuit 36, and defined as the off voltage VOFF1. The first voltage detection circuit 35 and the second voltage detection circuit 36 are examples of a switch voltage detection circuit.

The CPU 34A sends the on-command signal to the charging current shutoff FET 31 to turn the charging current shutoff FET 31 back on (S16). A preferable period in which the off-command signal is sent to the charging current shutoff FET 31 is several milliseconds or as short as possible. By turning off the charging current shutoff FET 31, instability in power supply to the load 6 can be reduced.

The CPU 34A determines whether a first on-off voltage difference AV1 is lower than a second threshold TH2 (S17). The on-off voltage difference AV1 is an example of an input-output voltage determined by a controller based on a voltage detected by the switch voltage detection circuit. Specifically, the on-off voltage difference AV1 is a voltage difference between the on voltage VON1 and the off voltage VOFF1. The second threshold TH2 is an example of a first reference voltage. A preferable level of the second threshold TH2 slightly lower than the voltage difference between the on voltage VON1 and the off voltage VOFF1 detected in advance when the FETs 31 and 32 are not defective and able to perform proper operations.

If the on-off voltage difference AV1 is lower than the second threshold TH2 (YES in S17), the CPU 34A executes first error processing (S18). The CPU 34A executes the first error processing because the charging current shutoff FET 31 has a turn-off problem in which the charging current shutoff FET 31 does not turn off according to the off-command signal due to a short circuit between input and output or for some reason. In the first error processing, the CPU 34 issues a notification about the turn-off problem of the charging current shutoff FET 31 to the external devices including the ECU. When the first error processing is complete, the CPU 34 terminates the switch failure detection process. If the on-off voltage difference AV1 is higher than the second threshold TH2 (NO in S17), the CPU 34A terminates the switch failure detection process without executing the first error processing.

If the on voltage VON1 is higher than the first threshold TH1 (NO in S13), the CPU 34A executes second error processing (S19). The CPU 34A executes the second error processing because at least one of the circuits 35 and 36 is defective or at least one of the FETs 31 and 32 is defective and thus the switch failure detection process may not be properly executable. In the second error processing, the CPU 34 issues a notification about the failure of at least one of the circuits 35 and 36 or at least one of the FETs 31 and 32 to the ECU. When the second error processing is complete, the CPU 34 terminates the switch failure detection process.

Switch Failure Detection Process for Discharging Current Shutoff FET 32

If the secondary battery 2 is not in the discharging state, that is, in the charging state (NO in S11), the CPU 34A detects an on voltage VON2 between the first connection terminal T1 and the third connection terminal T3 (S20). The on voltage VON2 is an example of a terminal voltage. Specifically, the on voltage VON2 is a voltage drop between the FETs 31 and 32 while the on-command signals are sent to the FETs 31 and 32. In this embodiment, a voltage difference between the first voltage V1 and the second voltage V2 is calculated based on the detection signals from the first voltage detection circuit 35 and the second voltage detection circuit 36, and defined as the on voltage VON2.

The CPU 34A determines whether the on voltage VON2 is lower than a third threshold TH3 (S21) to determine whether the switch failure detection process is properly executable on the discharging current shutoff FET 32. The third threshold TH3 is an example of a second reference voltage. A preferable level of the third threshold TH3 is slightly higher than the on voltage VON2 that is detected when the voltage detection circuits 35 and 36 and the FETs 31 and 32 are not defective and able to perform proper operations.

If the on voltage VON2 is lower than the third threshold TH3 (YES in S21), the CPU 34A sends the off-command signal to the discharging current shutoff FET 32 to turn off the discharging current shutoff FET 32 (S22). The CPU 34A turns off the discharging current shutoff FET 32 because the switch failure detection process is properly executable if the on voltage VON2 is lower than the third threshold TH3. A forward direction of the parasitic diode D2 corresponds to a direction in which a charging current flows. Therefore, the charging current continues flowing into the second battery 2 via the parasitic diode D2 after the discharging current shutoff FET 32 is turned off.

The CPU 34A detects an off voltage VOFF2 between the first connection terminal T1 and the third connection terminal T3 (S23). The off voltage VOFF2 is an example of a voltage between an input and an output of an electronic switch. Specifically, the off voltage VOFF2 is a voltage drop between the FETs 31 and 32 during sending of the on-command signal to the charging current shutoff FET 31 and the off-command signal to the discharging current shutoff FET 32. In this embodiment, a voltage difference between the first voltage V2 and the second voltage V2 is calculated based on the detection signals from the first voltage detection circuit 35 and the second voltage detection circuit 36, and defined as the off voltage VOFF2.

The CPU 34A sends the on-command signal to the discharging current shutoff FET 32 to turn the discharging current shutoff FET 32 back on (S24). A preferable period in which the off-command signal is sent to the discharging current shutoff FET 32 is several milliseconds or as short as possible. By turning off the discharging current shutoff FET 32, instability in charging of the second battery 2 can be reduced.

The CPU 34A determines whether a second on-off voltage difference AV2 is lower than a fourth threshold TH4 (S25). The on-off voltage difference AV2 is an example of an input-output voltage determined by a controller based on a voltage detected by the switch voltage detection circuit. Specifically, the on-off voltage difference AV2 is a voltage difference between the on voltage VON2 and the off voltage VOFF2. The fourth threshold TH4 is an example of a first reference value. A preferable level of the fourth threshold TH4 slightly lower than the voltage difference between the on voltage VON2 and the off voltage VOFF2 detected in advance when the FETs 31 and 32 are not defective and able to perform proper operations.

If the on-off voltage difference AV2 is lower than the fourth threshold TH4 (YES in S25), the CPU 34A executes third error processing (S26). The CPU 34A executes the third error processing because the discharging current shutoff FET 32 may have a turn-off problem in which the discharging current shutoff FET 32 does not turn off according to the off-command signal if the on-off voltage difference AV2 is lower than the fourth threshold TH4. In the third error processing, the CPU 34 issues a notification about the turn-off problem of the discharging current shutoff FET 32 to the external devices including the ECU. When the third error processing is complete, the CPU 34 terminates the switch failure detection process. If the on-off voltage difference AV2 is higher than the fourth threshold TH4 (NO in S25), the CPU 34A terminates the switch failure detection process without executing the third error processing.

If the on voltage VON2 is higher than the third threshold TH3 (NO in S21), the CPU 34A executes the second error processing (S19), and terminates the switch failure detection process. The CPU 34A executes the second error processing because the switch failure detection process cannot be properly performed.

In this embodiment, the turn-off problem is determined if the detected on-off voltage difference AV1 is lower than the second threshold TH2 under the condition that the off-command signal is sent to the charging current shutoff FET 31 while the second battery 2 is in the discharging state. The discharging current I from the secondary battery 2 continues flowing into the load 6 via the parasitic diode D1 after the charging current shutoff FET 31 is turned off. Therefore, the turn-off problem of the charging current shutoff FET 31 can be detected while the power supply to the load 6 is maintained.

The turn-off problem is also determined if the detected on-off voltage difference AV2 is lower than the fourth threshold TH4 under the condition that the off-command signal is sent to the discharging current shutoff FET 32 while the second battery 2 is in the charging state. The charging current from the charger 5 continues flowing into the secondary battery 2 via the parasitic diode D2 after the discharging current shutoff FET 32 is turned off. Therefore, the turn-off problem of the discharging current shutoff FET 32 can be detected while the charging of the secondary battery 2 by the charger 5 is maintained. The switch failure detection process is performed in both cases in which the secondary battery 2 is in the charging state and in the discharging state by controlling the FETs 31 and 32. In comparison to a configuration in which the FETs 31 and 32 are connected in different paths, the number of conductive lines or monitoring devices can be reduced. Namely, the configuration of this embodiment is simpler.

If the on-off voltage differences AV1 and AV2 are lower than the respective thresholds TH2 and TH4, the turn-off problem is determined. In comparison to a configuration in which the turn-off problem is determined if the off voltage VOFF1 or VOFF2 is lower than a threshold, accuracy in detection of the turn-off problem is less likely to be reduced even the on-resistance of the FET 31 or 32 varies when the FET 31 or 32 becomes defective.

If the FET 31 or 32 becomes defective and the on-resistance thereof increases or the voltage detection circuit 35 or 36 becomes defective, the turn-off problem may not be properly detected. In this embodiment, the switch failure detection process is executed if the on voltage VON1 or VON2 is lower than the corresponding first threshold TH1 or TH3. Therefore, the switch failure detection process is less likely to be executed in the condition that the turn-off problem is not properly detected.

OTHER EMBODIMENTS

The scope of the present invention is not limited to the above embodiment. The following embodiments are also included in the scope of the technologies described herein.

The controller 34 may include a plurality of CPUs or a hardware circuit such as an application specific integrated circuit (ASIC). Alternatively, the controller 34 may include both hardware circuit and CPU. At least two of the overcharge control step, the over-discharge control step, the determination of the state, the sending of the off-command signal, the determination of proper execution of the switch failure detection process, and the determination of the turn-off problem may be performed by different CPUs or hardware circuits. The sequence in which the above operations are performed may be altered.

The switches may be bipolar transistors, relays, or any types of switches that do not include parasitic diodes. The rectifiers may be diodes or diode-connected transistors. An output of one of the diode-connected transistors is connected to an input of another of the diode-connected transistors. However, the embodiment described earlier can perform the switch failure detection process using existing components without additional components.

The controller 34 may be configured to determine whether the switch failure detection process is properly executable based on a voltage of one of the cells or voltages of the cells in the secondary battery 2.

The controller may be configured to execute the switch failure detection process for only one of the charging current shutoff FET 31 and the discharging current shutoff FET 32.

The input-output voltage may be the off voltage VOFF1 or the off voltage VOFF2.

What is claimed is:
1. A switch failure detector configured to be installed in an electric system including an electric storage device, the switch failure detector comprising:

at least one electronic switch connected in a path in which a charging current to the electric storage device and a discharging current from the electric storage device flow;

at least one rectifier for passing a discharging current by bypassing the electronic switch when the electronic switch is turned off;

a switch voltage detection circuit configured to detect a voltage drop caused by the at least one electronic switch; and a controller for:
sending an on-command signal to the at least one electronic switch to turn on the electronic switch; and receiving the voltage detected by the switch voltage detection circuit while the on-command signal is sent to the electronic switch.

2. The switch failure detector according to claim 1, wherein the controller determines an input-output voltage of the at least one electronic switch based on the voltage.

3. The switch failure detector according to claim 2, wherein the controller determines whether the input-output voltage is lower than a reference voltage.

4. The switch failure detector according to claim 3, wherein the controller determines that a switch failure detection process is executable if the input-output voltage is lower than the reference voltage.

5. A switch failure detector configured to be installed in an electric system including an electric storage device, the switch failure detector comprising:
at least one electronic switch connected in a path in which a charging current to the electric storage device and a discharging current from the electric storage device flow;

at least one rectifier for passing a discharging current by bypassing the electronic switch when the electronic switch is turned off;

a switch voltage detection circuit configured to detect a voltage between an input and an output of the at least one electronic switch; and a controller for:
sending an on-command signal to the at least one electronic switch to turn on the electronic switch; and receiving the voltage detected by the switch voltage detection circuit while the on-command signal is sent to the electronic switch.

6. The switch failure detector according to claim 5, wherein the controller determines whether the input-output voltage is lower than a reference voltage.

7. The switch failure detector according to claim 6, wherein the controller determines that a switch failure detection process is executable if the input-output voltage is lower than the reference voltage.

8. A battery pack, comprising:
an electric storage device; and
the switch failure detector according to claim 1.

9. A battery pack, comprising:
an electric storage device; and
the switch failure detector according to claim 5.

10. An electric system, comprising:
an external device including a load; and
the battery pack according to claim 8,
wherein the electric storage device supplies power through the path to the load.

11. An electric system, comprising:
an external device including a load; and
the battery pack according to claim 9,
wherein the electric storage device supplies power through the path to the load.

12. A method of detecting a defect in an electric system including an electric storage device, an electronic switch, a rectifier, and a switch voltage detection circuit, the electronic switch being connected in a path in which a charging current to the electric storage device and a discharging current from the electric storage device flow, the rectifier being configured to pass a discharging current by bypassing the electronic switch when the electronic switch is turned off, the method comprising:
determining whether the electric storage device is in a discharging state;

sending an on-command signal to the at least one electronic switch to turn on the electronic switch; and receiving the voltage detected by the switch voltage detection circuit while the on-command signal is sent to the electronic switch.

13. The method according to claim 12, further comprising:
determining an input-output voltage of the at least one electronic switch based on the voltage.

14. The method according to claim 13, further comprising:
determining whether the input-output voltage is lower than a reference voltage.

15. The method according to claim 14, further comprising:
determining that a switch failure detection process is executable if the input-output voltage is lower than the reference voltage.

* * * * *